United States Patent
Sakai et al.

(10) Patent No.: US 6,779,482 B2
(45) Date of Patent: Aug. 24, 2004

(54) PLASMA DEPOSITION DEVICE FOR FORMING THIN FILM

(75) Inventors: Osamu Sakai, Nara-ken (JP); Satoshi Okamoto, Mie-ken (JP); Toshio Akai, Kyoto-fu (JP)

(73) Assignee: Sharp Kabushiki Kaisha, Osaka (JP)

( * ) Notice: Subject to any disclaimer, the term of this patent is extended or adjusted under 35 U.S.C. 154(b) by 15 days.

(21) Appl. No.: 09/815,160

(22) Filed: Mar. 22, 2001

(65) Prior Publication Data

US 2002/0007793 A1 Jan. 24, 2002

(30) Foreign Application Priority Data

Mar. 23, 2000 (JP) .......................... 2000-081464
Jan. 18, 2001 (JP) .......................... 2001-009963

(51) Int. Cl.[7] .......................... C23C 16/00; H05H 1/00

(52) U.S. Cl. .......................... 118/723 E; 118/723 AN; 156/345.43

(58) Field of Search .................. 118/723 E–723 AN; 156/345.43–345.47; 134/1.1, 1.2; 315/111.21; 438/710; 427/569; 204/298.31, 298.41, 298.01, 192.1

(56) References Cited

U.S. PATENT DOCUMENTS

| 4,292,153 | A | * | 9/1981 | Kudo et al. ................ 204/164 |
| 5,543,688 | A | * | 8/1996 | Morita ................... 315/111.21 |
| 5,936,352 | A | * | 8/1999 | Samukawa et al. ..... 315/111.51 |
| 5,938,854 | A | * | 8/1999 | Roth .............................. 134/1 |

FOREIGN PATENT DOCUMENTS

| JP | 61-226920 A | * | 10/1986 | .......... H01L/21/205 |
| JP | 62-273731 A | * | 11/1987 | .......... H01L/21/302 |
| JP | 1-230782 A | * | 9/1989 | ........... C23C/16/50 |
| JP | 11-144892 | | 5/1999 | ............ H05H/1/46 |
| JP | 2000-3878 A | * | 1/2000 | .......... H01L/21/205 |

* cited by examiner

*Primary Examiner*—Parviz Hassanzadeh
(74) *Attorney, Agent, or Firm*—Edwards & Angell, LLP; David G. Conlin, Esq.; Richard J. Roos, Esq.

(57) ABSTRACT

A plasma deposition device 1 comprises electrodes 13 mounted on an electrode substrate 11, gas introducing holes 12 provided between said electrodes 13 for introducing material gas G to the interior, a deposition substrate 30 provided to oppose to said electrodes 13 from a predetermined distance d, and a power source 60 generating plasma from said material gas by providing energy thereto, wherein material gas G is resolved to active species R deposited on said deposition substrate 30, characterized in applying voltage to adjacent electrodes 13 so as to generate discharge DC.

32 Claims, 8 Drawing Sheets

Fig. 6
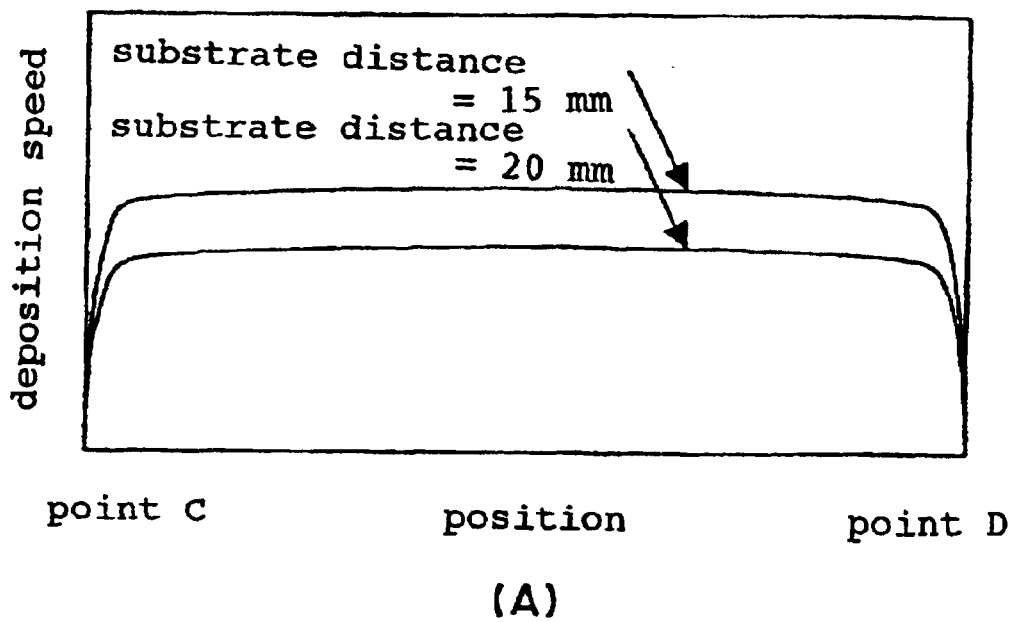
(A)
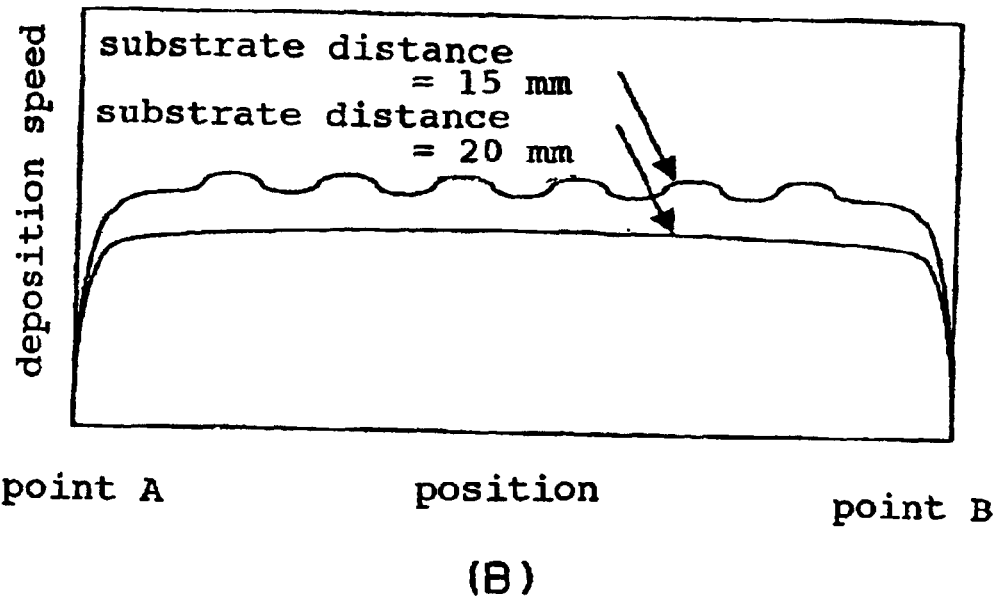
(B)

Fig. 8 PRIOR ART

PLASMA DEPOSITION DEVICE FOR FORMING THIN FILM

FIELD OF THE INVENTION

The present invention relates to a plasma deposition device for forming a thin film, especially a plasma deposition device for forming a film functioning as a semiconductor. More specifically, the present invention relates to a plasma deposition device for forming a thin film preferably utilizing a plasma-excited chemical vapor deposition method utilized for manufacturing an insulation film or a semiconductor film such as amorphous silicon (hereinafter referred to as a-Si) utilized in the electronic industry.

DESCRIPTION OF THE RELATED ART

The method for manufacturing an electronic device such as an integrated circuit, a liquid crystal display, an amorphous solar battery and the like by depositing a semiconductor film and the like using plasma is called a plasma-excited chemical vapor deposition (CVD) method, which is advantageous in its simplicity and its maneuverability and is applied to manufacture various electronic devices.

The general CVD method will now be explained, with reference to FIGS. 8 and 9 showing the structure of a plasma deposition device (plasma CVD device) utilizing this general CVD method. FIG. 8 is a cross-sectional view explaining the concept of the structure of the plasma CVD device, and FIG. 9 is a perspective view showing the structure of the main portion of the device.

A prior-art plasma CVD device comprises a first electrode 13-1 mounted on the first surface of an electrode substrate 11, a gas supply space 15 formed to the back side of the electrode substrate 11, a deposition substrate 30 arranged to oppose to the first electrode 13-1 with a predetermined distance d in between, a second electrode 13-2 mounted to the back surface of the deposition substrate 30, a vacuum container 50, an induction terminal 51, a deposition substrate holder 52, a power source 60, and a gas supply unit 70. A plurality of gas introducing holes 12 are provided to the electrode substrate 11 and the first electrode 13-1 mounted thereto, supplying material gas G to plasma generation space 10. High-frequency output from the power source provides electric energy to the first electrode 13-1 and the second electrode 13-2. The gas supply unit 70 is connected via a gas supply tube 16 to the gas supply space 15, through which material gas for forming the thin film is supplied during deposition.

The plasma CVD device generates plasma by causing discharge DC to be performed between the first electrode 13-1 and the second electrode 13-2, which are two conducting plates mutually insulated and opposed to each other in parallel, and provides material gas G thereto so as to dissociate the gas and to generate radicals R. Thereby, a semiconductor film and the like is deposited on the deposition substrate 30 made of silicon or glass and mounted to the second electrode 13-2.

The means for generating plasma that resolves the material gas to be deposited utilizes a high-frequency power generally having a frequency of 13.56 MHz. That is, one conductor plate electrode 13-2 is set to ground potential, and high-frequency voltage is applied between the electrode 13-1 opposed thereto, thereby generating a high-frequency electric field between both conductor plates. This state of breakdown generates plasma as a glow discharge phenomenon. The electrode 13-1 to which high-frequency voltage is impressed is called the cathode electrode, and a large electric field is formed near the electrode, which accelerates the electron in the plasma and encourages dissociation of material gas, thereby generating radicals R.

Accompanied by the recent advancement in plasma engineering and semiconductor engineering, a new proposal has been made to the plasma CVD method. One example involves improving the deposition speed of the semiconductor film by increasing the frequency of the utilized high frequency output from 13.56 MHz to a VHF band (J. Vac. Sci. Technol. A10 (1992) 1080, A. A. Howling).

Electronic devices such as the liquid crystal display or the amorphous solar battery are especially large-sized electronic devices, and there is strong demand for a larger product formed by utilizing a deposition substrate 30 having a size ranging from the order of 10 cm square to 1 m square.

However, there is a limit to the prior art method related to forming a thin film by deposition to a deposition substrate 30 having a small size. A large-sized electronic device such as a liquid crystal display or an amorphous solar battery was difficult to manufacture according to the prior art method, since it was difficult to deposit a high-quality film having a uniform film thickness to a deposition substrate 30 having a large area.

One reason causing difficulty in securing a uniform film thickness is that when high frequency is used, the inductance of the material constituting electrodes 13-1 and 13-2 or the partial difference in electrical connection of the parts constituting the electrodes 13-1 and 13-2 causes high-frequency power that generates uneven plasma on the deposition substrate 30, resulting in uneven density distribution of the plasma particles and radical particles. As a result, the thickness of the film formed on the deposition substrate 30 varies locally.

In the case of a TFT (thin film transistor) liquid crystal display utilizing an a-Si film, if the thickness of the a-Si film functioning as the switching layer varies within one deposition substrate 30, the switching property is partially varied, and thus, the display becomes uneven. There is a demand for a method that reduces the uneven distribution of the plasma density, and enables to grow a film having a uniform thickness on the deposition substrate 30.

One reason causing difficulty in obtaining a high-quality deposition is that the deposition substrate 30 is mounted on ground electrode during deposition. When plasma is generated, a potential difference called a sheath voltage occurs on the surface of the deposition substrate 30 positioned above the ground electrode, and basically such potential difference cannot be avoided as long as plasma exists. Sheath voltage accelerates the ion within the plasma towards the deposition substrate, which results in ions providing impact to the surface of the deposited film, deteriorating the quality of the film.

A method is proposed in Japanese Patent Laid-Open Publication No. 11-144892 that improves the film-thickness distribution to the deposition substrate 30 and deposits a high-quality film. The disclosed method for manufacturing the film includes providing a plurality of electrodes having a wavy uneven surface, and providing the deposition substrate 30 away from the electrodes so as to form a horizontal electric field, thereby enabling to manufacture a uniform and high-quality film having a large size. However, according to this deposition method, if discharge electrodes are formed to have a width of a couple of millimeters, the cross-section of the electrodes can be shaped as a triangle, a trapezoid, a semicircle, or a T-shape and the like, which causes the height of the electrodes to be varied for a couple of millimeters. Thereby, the surfaces of the electrodes are not positioned at fixed distances from the deposition substrate. If a uniform deposition is to be formed under such condition, the deposition substrate 30 must be separated by a considerably long distance away from the surfaces of the electrode surfaces so as to reduce the ratio of dispersion of the distance between each electrode for deposition. According further to this method, during formation of discharge electrodes, the step for forming a wavy form to the electrode formation surface having a large area ranging from the order of 10 cm square to over 1 m square requires high mechanical accuracy. Moreover, since the distance between electrodes is fixed according to the structure, the Paschen property for plasma generation (the value of plasma-discharge-starting voltage× inter-electrode distance relativity) limits the range of operating voltage. Even further, since voltage is simultaneously applied to plural electrode pairs, a power source 60 capable of outputting high electrical power is necessary.

SUMMARY OF THE INVENTION

With consideration to the above prior-art problems, the present invention aims at providing a plasma deposition device capable of forming a uniform and high-quality film deposition on a large-sized deposition substrate, and to increase the number of products (such as liquid crystal panel) to be taken from one deposition substrate, thereby contributing to the improvement of productivity.

The object of the present invention is to provide a plasma deposition device capable of realizing a high-quality film deposition, that enables to provide not only a high-quality a-Si film utilized for TFT liquid crystal display, but also a silicon dioxide film, a silicon nitride film, or a crystalline silicon film.

The plasma deposition device for forming a thin film according to the present invention comprises a function of introducing material gas to the interior, a function of generating a plasma state from the material gas by providing electric energy thereto, a function of resolving the material gas into active species, and a function of depositing the active species on a deposition substrate and forming a thin film, wherein the device is equipped with a plurality of electrodes positioned separately from the deposition substrate and each having an exposed surface parallel to the surface of the deposition substrate, and electric energy is supplied to the device by applying voltage between the electrodes.

Preferably, the plasma deposition device for forming a thin film has plurality of electrodes arranged in a striped form.

More preferably, the plasma deposition device for forming a thin film has the surface of the plurality of electrodes covered with a dielectric layer.

According to a further preferable example, the plasma deposition device for forming a thin film introduces material gas to the interior through a plurality of introducing holes provided between the plurality of electrodes.

Moreover, the plasma deposition device for forming a thin film applies voltage providing electric energy to the device either as a low frequency or as a high frequency.

Further, the plasma deposition device for forming a thin film applies voltage providing electric energy to the device in the state of a direct pulse.

Preferably, the plasma deposition device for forming a thin film applies the voltage providing electric energy to the device in a temporally staggered state according to position.

BRIEF DESCRIPTION OF THE DRAWINGS

FIG. 6 is a graph explaining the film-thickness unevenness of the a-Si film deposited on the deposition substrate when the distance between the deposition substrate and the electrode substrate is varied in the plasma deposition device according to the present invention;

DETAILED DESCRIPTION OF PREFERRED EMBODIMENTS

The structure of the plasma deposition device according to the present invention will now be explained with reference to FIGS. 1 through 7.

Figure 1:
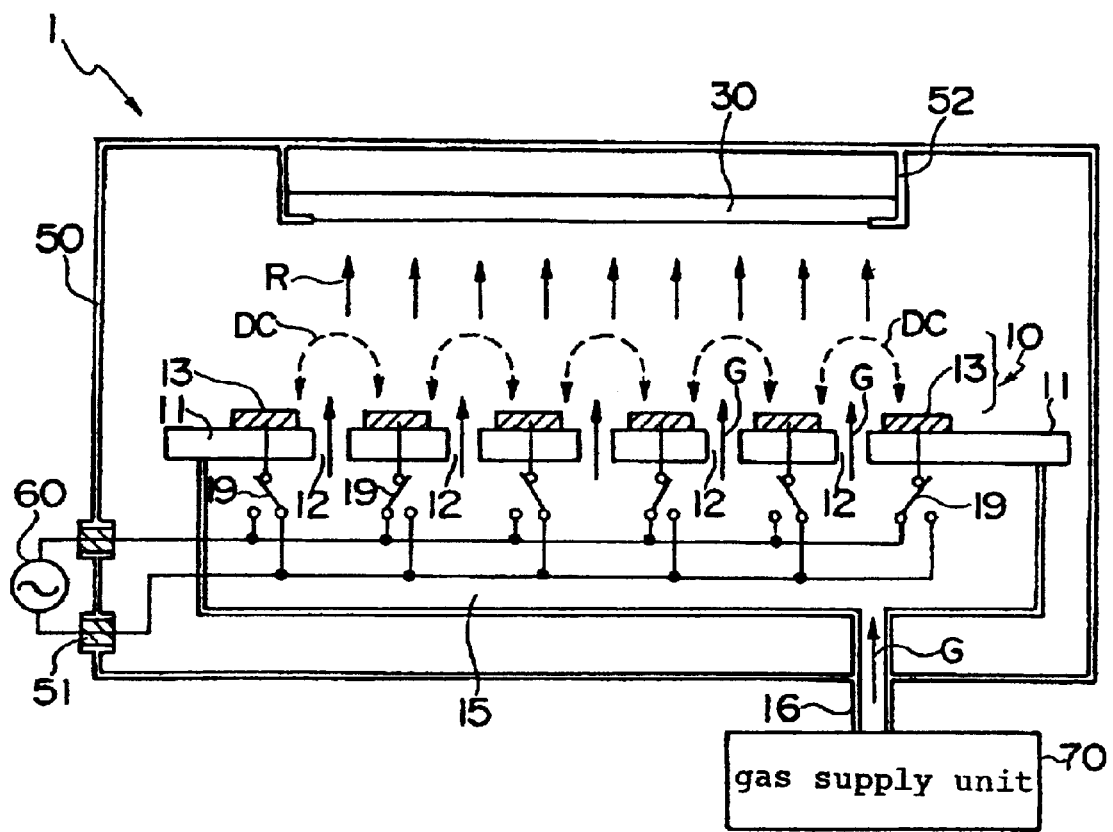
FIG. 1 is a cross-sectional view showing the outline of the structure of a plasma deposition device according to the present invention.
Figure 2:
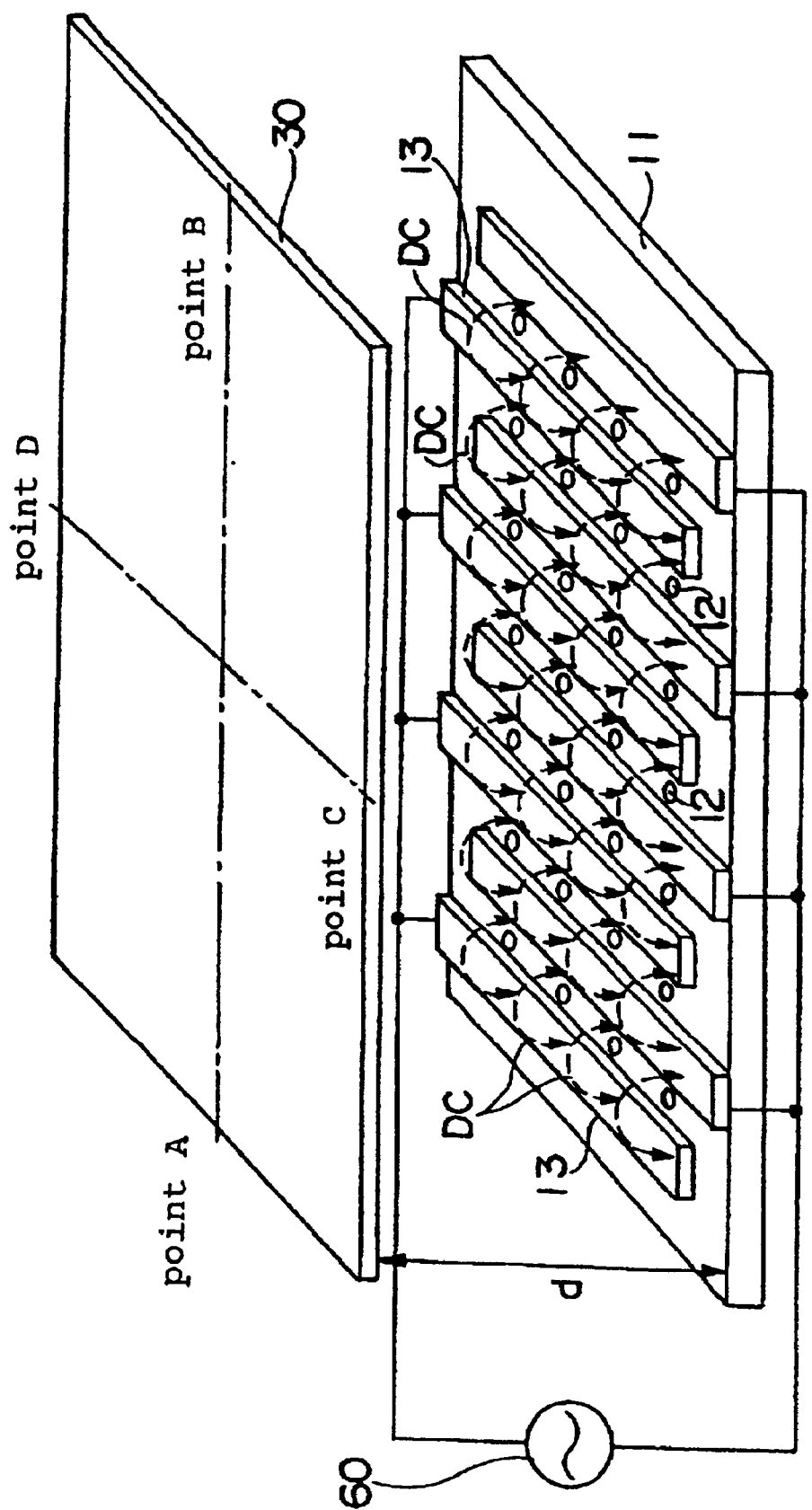
FIG. 2 is a perspective view showing the structure of the main portion of the plasma deposition device according to the present invention.

FIG. 1 is a cross-sectional view showing the outline of the plasma deposition device according to the first embodiment of the invention, and FIG. 2 is a perspective view showing the structure of the main portion of the device shown in FIG. 1.

The plasma deposition device 1 according to the present invention comprises, as shown in FIGS. 1 and 2, an electrode substrate 11, a plurality of electrodes 13 formed adjacent to one another in a striped form on the first surface of the electrode substrate 11, a gap supply space 15 formed to the back side of the electrode substrate 11, a deposition substrate 30 opposed to the electrodes 13 from a predetermined distance d, a vacuum container 50, an induction terminal 51, a deposition substrate holder 52, a power source 60, and a gas supply unit 70. Gas introducing holes 12 are arranged between the electrodes 13 that are mounted adjacent to each other on the electrode substrate 11. The power source 60 supplies high-frequency output providing electric energy to each electrode 13. The gas supply unit 70 is connected to the gas supply space 15 via a gas supply tube 16, through which the film forming material gas is supplied during deposition.

The surface of every electrode 13 is positioned to face the deposition substrate 30, and in other words, the exposed surface of the electrodes 13 and the surface of the deposition substrate 30 are arranged in parallel, with the surface of the electrodes 13 separated from the deposition substrate 30 by a predetermined distanced. Such electrodes 13 can be formed very easily for example by printing a desired pattern on a glass substrate 11. The high-frequency power from the power source 60 is applied to the electrodes 13.

The material gas G supplied from the gas supply unit 70 via the gas supply tube 16 to the gas supply space 15 passes through the gas induction holes 12 arranged between the electrodes 13 on the surface of the electrode substrate 11 to the plasma generation space 10.

The operation of the plasma deposition device 1 according to the embodiment will now be explained with reference to FIG. 3. According to this embodiment, three neighboring electrodes 13 are handled as one set of electrode groups, and of the electrodes within the one set of electrode groups, the one center electrode is provided with the output from the power source 60 (inner conductor unit in the case of a coaxial output, and negative voltage output unit in the case of a two-terminal output), and the two outer electrodes are connected to the ground potential unit of the power 60 (outer conductor unit in the case of a coaxial output, and positive voltage output unit in the case of a two-terminal output). Moreover, the one electrode positioned between neighboring two sets of electrode groups is connected so as to have the potential equal to that of the outside electrodes of the group of electrodes. For example, in the case of FIG. 3 (a), electrode $13^2$ corresponds to the one center electrode, to which is applied negative potential. Electrodes $13^1$ and $13^3$ correspond to the two outer electrodes, to which are applied ground potential. Farther, electrode $13^6$ corresponds to the one center electrode, to which is applied negative potential. Electrodes $13^5$ and $13^7$ correspond to the two outer electrodes, to which are applied ground potential. Electrode $13^4$ is applied with the same ground potential as that applied to the outer electrodes, or electrodes $13^3$ and $13^5$.

Figure 3:
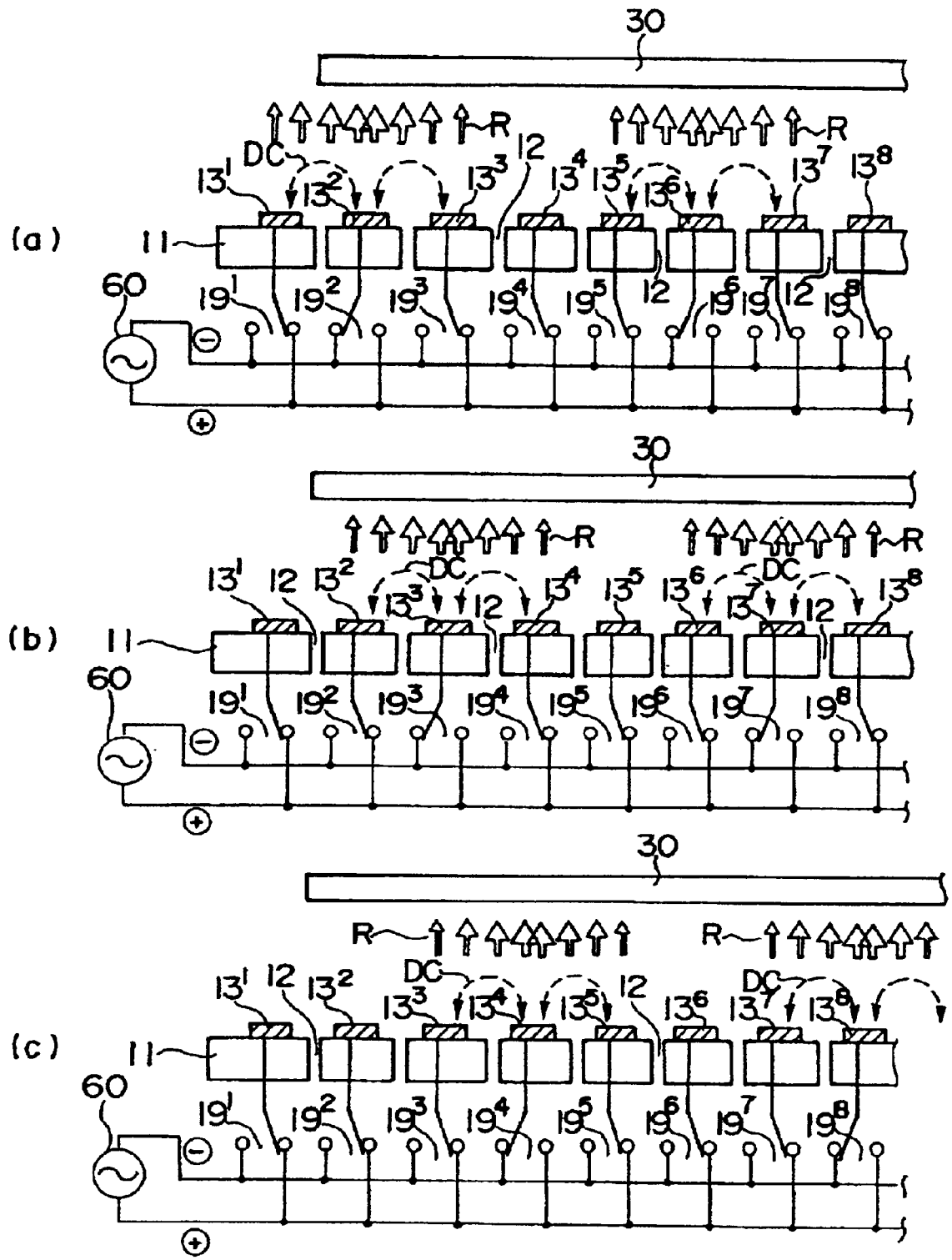
FIG. 3 is a simplified view explaining the method for providing electric energy to the plasma deposition device shown in FIG. 1.

According to such structure as shown in FIG. 3 (a), within one set of electrode groups, potential difference occurs between electrode $13^1$ and electrode $13^2$, and electrode $13^2$ and electrode $13^3$, and the greatest amount of radicals R is generated from the surface of the electrode $13^2$. The amount of radicals R being generated gradually decreases from electrode $13^2$ towards electrode $13^1$, or from electrode $13^2$ towards electrode $13^3$. Moreover, the electrode $13^4$ positioned between two sets of adjacent electrode groups is applied with voltage having the same potential as electrodes $13^3$ and $13^5$, which are positioned at the outer side of both electrode groups. No potential difference is generated between the electrodes $13^4$ and $13^3$, or electrodes $13^4$ and $13^5$.

By generating potential difference between adjacent electrodes within one set of electrodes, positioning one electrode between neighboring sets of electrodes that will not generate potential difference between neighboring electrodes, and sequentially switching a switch 19 to vary the voltage applied to each electrode and to move the voltage from one electrode to another, it is possible to sequentially send the generation of radicals R from the left end of the deposition substrate 30 to the right end thereof, as shown in FIGS. 3(b) and 3(c). Thereby, a uniform thin-film layer can be formed on the deposition substrate.

Figure 4:
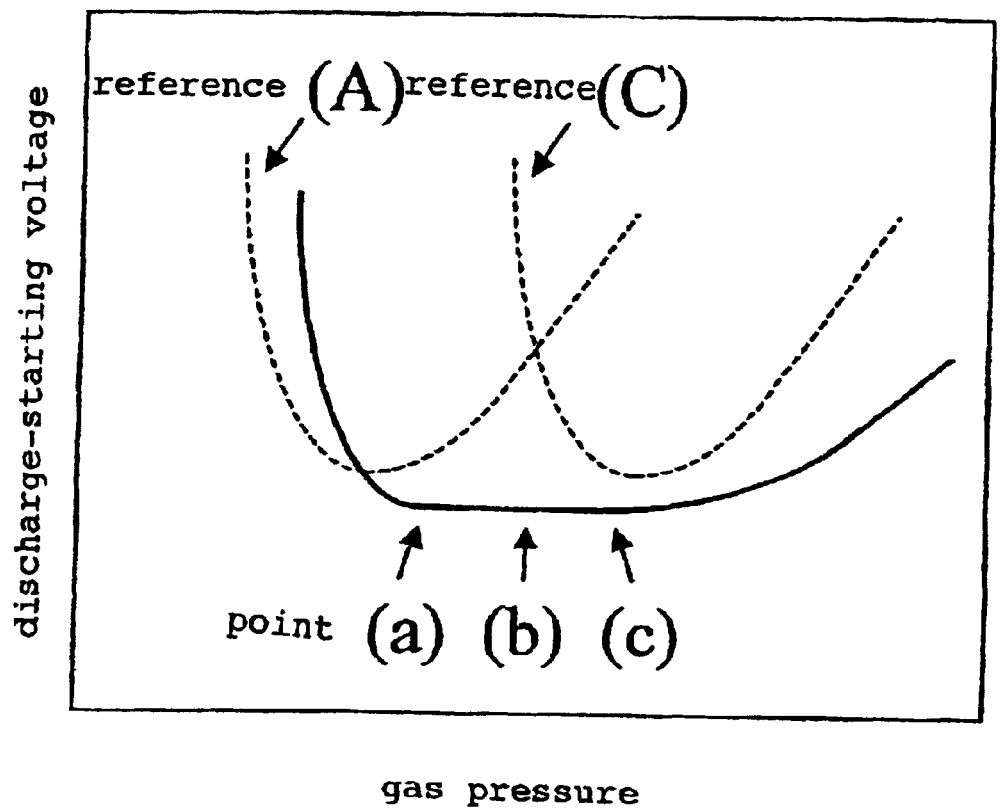
FIG. 4 is a graph explaining the gas pressure relativity of the plasma-discharge-starting voltage in the plasma deposition device according to the present invention.

FIG. 4 shows the gas-pressure-relativity property of a plasma-discharge-starting voltage obtained by measuring the relation between the plasma-discharge-starting voltage and the gas pressure of the plasma deposition device having the present structure.

As shown by the solid line of FIG. 4, the plasma deposition device according to the present invention has a wide gas pressure region including points (a), (b) and (c) where the plasma-discharge-starting voltage is low, or where discharge DC starts easily. In the case of the drawing, the flat region where the plasma-discharge-starting voltage is low extends from 30 Pa to 120 Pa, but the range of the pressure value varies depending on the material gas to be used.

Figure 5:
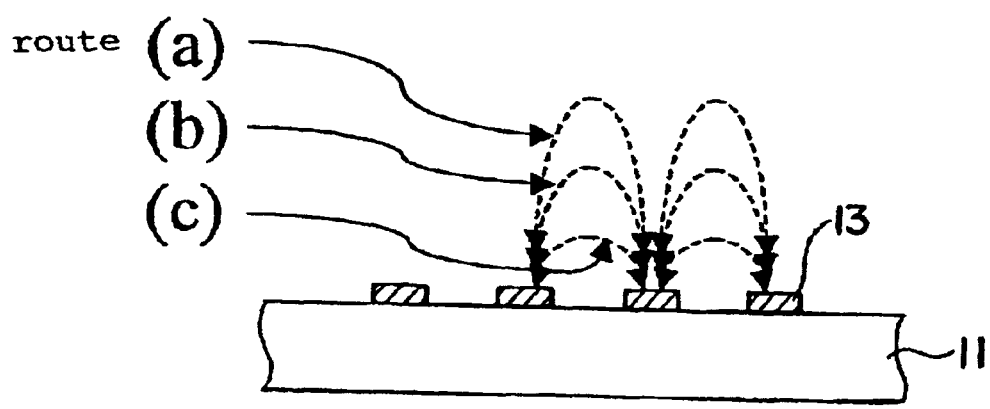
FIG. 5 is a drawing explaining the change in discharge route when gas pressure is varied in the plasma deposition device according to the present invention.

Within the flat region where the plasma-discharge-starting voltage is low, the emission of discharge DC corresponding to each pressure points (a), (b) and (c) are observed visually, and the observed route of discharge DC is shown in the cross-sectional view of FIG. 5. When the gas pressure is low at point (a), the discharge DC leaps up high, and the substantial route of discharge DC becomes long (route (a) shown in FIG. 5). On the other hand, when the pressure is at the high point (c), the emission of discharge DC is low and close to the electrode substrate 11, with a substantially short discharge DC route (route (c) shown in FIG. 5).

FIG. 6 shows the distribution of thickness of the a-Si film deposited on the deposition substrate 30 being measured.

Figure 8:
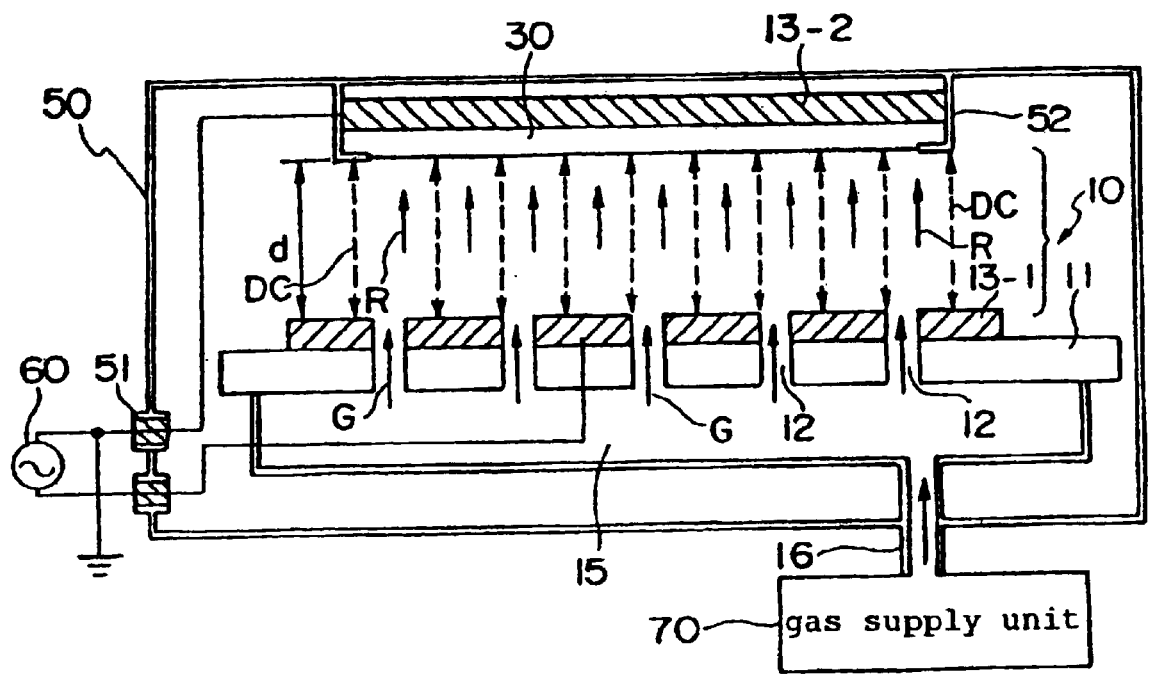
FIG. 8 is a diagram showing the outline of a typical structure of a prior-art plasma deposition device.
Figure 9:
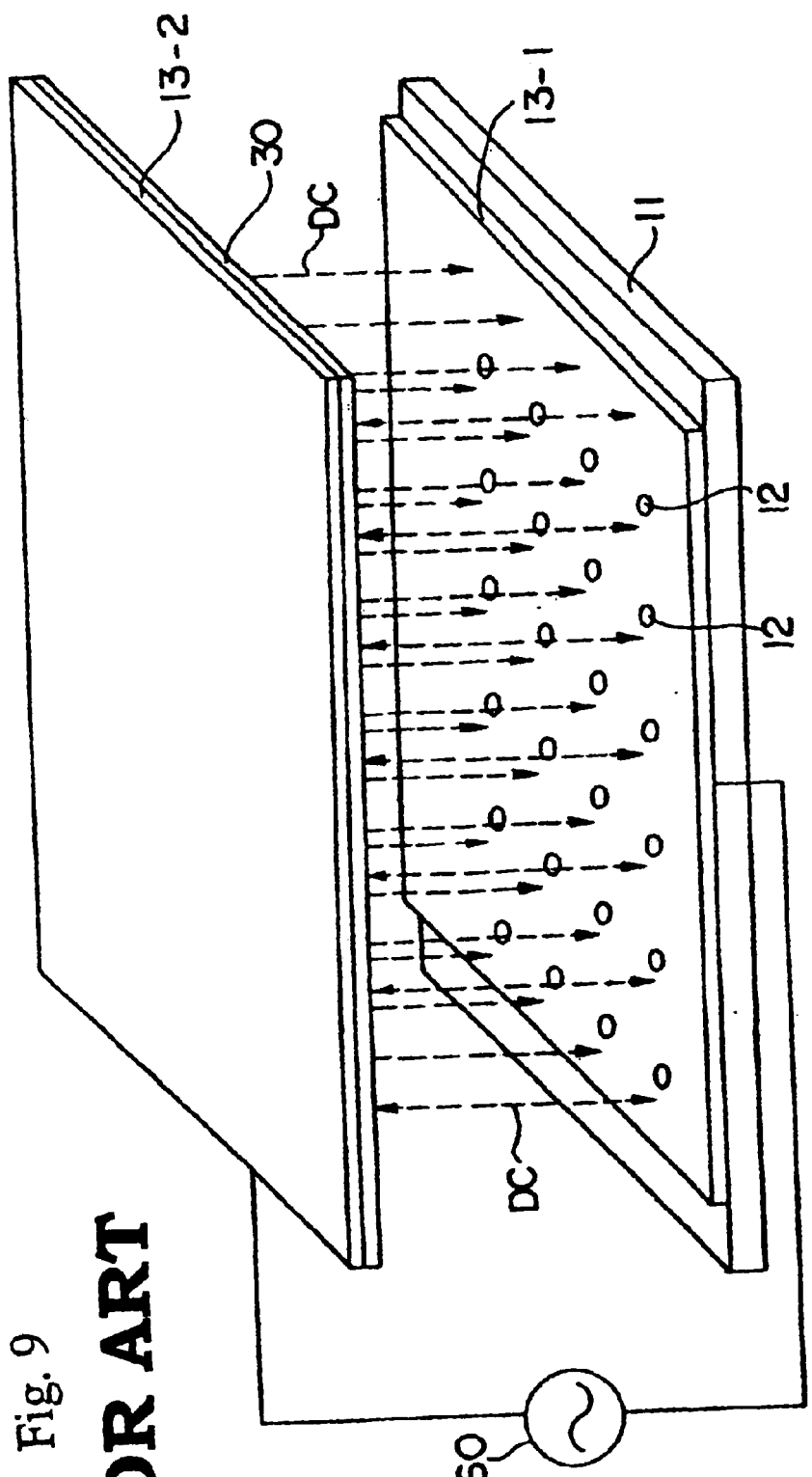
FIG. 9 is a perspective view showing the outline of the main structure of a prior-art plasma deposition device of FIG. 8.

On the other hand, the relation between the gas pressure and the plasma-discharge-starting voltage in the plasma deposition device shown in FIG. 8, where high-frequency voltage is applied to the first electrode 13-1 and the second electrode 13-2 mounted to the back surface of the deposition substrate 30, is shown as comparison data in FIG. 4 as reference (A) and reference (C) by broken lines. As shown in references (A) and (C), in both cases the plasma-discharge-starting voltage is minimized at a specific voltage, and in other regions the starting voltage is higher.

In other words, the discharge generated by the structure shown in FIG. 8 is a discharge DC where the route of the discharge is determined in advance, which is substantially equivalent to the prior-art method of parallel plate-type electrodes, or to the example of Japanese Patent Laid-Open Publication No. 11-144892 including plural electrodes having a wavy uneven surface. In all the cases, the discharge route or the distance between electrodes are determined. In case of reference property (A) the distance between the electrode substrate 11 and the deposition substrate 30 is longer than the electrode pitch distance, and in case of reference property (C) the distance between the electrode substrate 11 and the deposition substrate 30 is substantially equal to the electrode pitch distance. In either case, the pressure relativity is a minimal value, and no flat region exists where the discharge-starting pressure is low. In other words, even a small difference in pressure changes the discharge-starting voltage greatly. Moreover, the distribution of film thickness is concaved or convexed according to the operating point of the Paschen property, or on which side the value (pressure×inter-electrode distance relativity) is from the minimal value.

On the other hand, according to the plasma deposition device of the present invention as shown in FIG. 1, an arch-shaped electric field passage is formed between adjacent electrodes 13, and since the arch-shaped passage can take any shape corresponding to the pressure, such as expanding upward or sticking close to the substrate, the substantial inter-electrode distance can be varied based on the change in the length of route of the electric field. In other words, the present invention does not utilize a horizontal electric field as disclosed in Japanese Patent Laid-Open Publication No. 11-144892, but in stead, utilizes an arch-shaped electric field having a greater degree of freedom. Since discharge DC is generated along the arch-shaped electric field, a flat region having low plasma-discharge-starting voltage extending to a wide range of gas pressure is realized, as shown in FIG. 4, and according to this wide flat low-voltage region the discharge DC is stabilized, and as a result, a more uniform film distribution is realized. Further, the present invention is advantageous since the pressure of the gas can be varied within a single deposition process. Moreover, as shown in FIG. 3, radical flow R is mainly generated on the surface of the electrode close to the negative potential. In the case of the device shown in Japanese Patent Laid-Open Publication No. 11-144892, the distance between the electrode surfaces and the deposition substrate is varied because of the waveform structure of the electrodes, so the distance that the radical flow R generated on the surf ace of the electrode travels to reach the deposition substrate differs according to where the radical is generated. Since the radicals disappear gradually during travel, the amount of radicals reaching the deposition substrate 30 varies according to location if the distance of travel differs, and as a result, the thickness of the formed film becomes uneven. On the other hand, in the case of the present invention, since the electrode surface and the surface of the deposition substrate is parallel, the radical flow R generated on the surf ace of the electrode travels substantially the same distance before reaching the deposition substrate 30, thereby realizing a uniform film thickness. According to the present invention, the electrode surface and the deposition substrate surface are parallel, and so a flat region where the plasma-discharge-starting voltage is maintained low is realized throughout a wide gas pressure region, and every radical flow R substantially travels the same distance before reaching the substrate. These are the two characteristics enabling the formation of a uniform film deposition.

The graph of FIG. 6 is ref erred to in explaining the relation between the deposition speed and the distance d between the electrodes 13 and the deposition substrate 30 in various areas of the deposition substrate 30 of the present invention. FIG. 6(A) shows the deposition property between point C and point D of FIG. 2, and FIG. 6(B) shows the deposition property between point A and point B of FIG. 2. As shown in FIG. 6, if the distance d between the substrates are set substantially equal to the electrode pitch distance, the shape of the electrodes 13 will influence the distribution of the deposition speed, but by setting the distance d between substrates to be greater than the electrode pitch distance, the influence of the shape of the electrodes 13 will not appear on the deposited film, and a film-thickness uniformity of within ±5% of the average value can be obtained.

As for the arrangement of the electrodes 13, a face-like plasma generation space 10 should be formed along the shape of the substrate, so the electrodes 13 can be arranged in any arbitrary arrangement on the electrode substrate surface. However, if multiple electrodes are arranged in a dot-like manner, there is a need to provide a three-dimensional configuration of the induction terminal 51 and the electrodes in order to apply positive/negative potentials to the electrodes, On the other hand, if the electrodes are arranged in a striped manner, there is no need for a three-dimensional configuration, and it is possible to connect the induction terminal 51 to the area extended from the end of the electrode substrate 11, which enables a more simplified device structure.

An alternating power source having a frequency ranging from a low frequency region of 60 Hz to a high frequency region of 13.56 MHz can widely be used as the power source 60 for supplying electric energy to the deposition device mentioned above. Alternating power source is used to apply positive/negative voltage between adjacent electrodes 13, so the cathode electrode 13 alternates mutually between adjacent electrodes temporally. That is, all electrodes 13 act at some point as the cathode electrode, and since more radicals are generated near the cathode, a more uniform radical generation throughout the electrode substrate 11 is enabled and the film distribution becomes advantageously uniform.

According to the present invention, the position of the distribution substrate 30 is separated from the anode electrodes, so the ion impact to the anode electrode that increases during low frequency does not provide any bad influence to the film surface deposited on the deposition substrate 30. Therefore, the present method is capable of utilizing a low-frequency power source that can be handled easier than high-frequency power source.

It is possible to utilize a direct pulse power source as the power source 60 for providing electric energy to the device. In this case, as shown in FIG. 3, negative voltage is applied sequentially to a plurality of electrodes 13. Thereby, all the electrodes 13 operate as a cathode electrode, and since more radicals are generated near the cathode, a more uniform radical generation throughout the electrode substrate 11 is enabled and the film distribution becomes advantageously uniform. Accordingly, by using a direct current pulse power source, the same effect as an alternating current power source is obtained by using a simpler and easily handled electric energy supply source.

It is possible to temporally stagger the power supply to individual electrodes 13. That is, as shown in FIG. 3, if the same amount of electric energy is supplied to individual electrodes 13 within a time average, the timing of supply can be staggered between electrodes. By utilizing this function, as shown in FIG. 3, the switch provided on a wiring extended to each electrode 13 can be switched to provide electric energy from only one power source 60 to all the electrodes 13. In other words, even if the power source 60 itself is a direct current power source, the output thereof can be switched to temporally stagger the supply of power to individual electrodes 13, thereby using the power source 60 to function as a direct pulse.

The present inventors utilized the device with a structure as shown in FIG. 1 to generate plasma and to deposit an a-Si film. The utilized material gas is $SiH_4$, and except for the case shown in FIG. 4 and FIG. 5, the pressure is set to 100 Pa. The material gas is not limited to $SiH_4$, but according to the variety of the film to be deposited, gasses such as $H_2$, Ar, $O_2$ or $NH_3$, or a mixture of these gasses can be mixed with the $SiH_4$ gas.

The above explanations on forming a semiconductor film was mainly focused on an a-Si film, but according to the present invention, an insulation film such as a silicon nitride film or a silicon oxide film can also be formed by changing the material gas used in the method.

(Embodiments)

The embodiments of the plasma deposition device for forming a thin film according to the present invention will now be explained demonstratively.

EXAMPLE 1

The result of forming an a-Si film utilizing the plasma deposition device for forming a thin film (plasma CVD device) 1 according to the present invention will now be explained.

Although not shown in FIG. 1, the plasma deposition device is equipped with a heater mounted to the back of the deposition substrate holder 52 supporting the deposition substrate 30, so as to heat the deposition substrate 30 (to a temperature of 200° C. in deposition substrate temperature).

The device is further equipped with a mechanical booster pump or a rotary pump for discharging gas. The material gas is $SiH_4$ (flow rate: 1000 sccm) with a pressure of 100 Pa, and the supply of material gas is performed through gas induction holes 12 arranged between the stripe-shaped electrodes 13 on the electrode substrate 11, as shown in FIG. 1.

A high-frequency energy of 100 kHz (voltage 500 V) is used as the electric energy to be supplied. The plurality of electrodes 13 to which the high-frequency power is applied is arranged in a striped manner on a dielectric (glass) plate having a size of 1 m×1 m. The length of each electrode 13 is 95 cm, the width is 5 mm, and the thickness is 100 μm. The interval between the electrodes 13 is set to 5 mm, and the surface of the electrodes 13 are all facing the direction of the deposition substrate 30, or in other words, the surface of each electrode 13 being exposed is parallel to the surface of the deposition substrate 30. The positive or negative polarity of the power source 60 is alternately connected to the electrodes 13, so that when output of the power source 60 is applied to one electrode 13, no power will be applied to the adjacent electrodes 13, thereby inducing voltage between neighboring electrodes 13. The gas induction holes 12 are formed on the electrode substrate 11 so that each has a diameter size of 0.5 mm and with 10-mm-intervals between the electrodes 13. The deposition substrate 30 for growing the a-Si film is a glass substrate having a thickness of 3 mm is positioned opposing the electrode substrate 11 and placed at a distance of 20 mm from the electrode substrate 11.

Table 1 shows the result of deposition when the distance d between electrodes is changed. For comparison means, the result of deposition utilizing the prior-art plasma CVD device as shown in FIG. 8 is also shown in the table. The conditions are the same except for the structure of the electrodes. The uneven film thickness in the table shows the ratio of maximum/minimum deflection against the average film thickness.

deposition speed is not very different from the plasma CVD device having the structure shown in FIG. 1, but the film-thickness unevenness is not as good. The reason for this is because according to the plasma CVD device having the structure shown in FIG. 8, the distance between electrode 13-1 and electrode 13-2 is determined by the structure, so the Paschen property holds an acute minimal value. Therefore, it is difficult to accurately adjust the operating point on the Paschen property, and as a result, the film-thickness unevenness cannot be reduced.

According to the plasma CVD device having the structure of the present invention, the substantial distance between electrodes 13 vary spontaneously according to pressure, and there is no generation of film-thickness unevenness that is caused by the operating point of the Paschen property observed in the structure shown in FIG. 8. Therefore, by merely preventing unevenness of the radical generation positions on the electrode substrate 11 caused by the striped electrode structure, the device realizes an extremely uniform film.

Moreover, the result of measurement of the inner-film hydrogen bond of the thin film formed by the method using the plasma deposition device according to the present invention is explained in the following.

That is, the Si-H bond quantity is 10.5% of the total bond, and the Si—$H_2$ bond quantity is 0.5% of the total bond. Generally, the less the amount of total bonded hydrogen, there is a greater ratio of Si—Si bond, which is preferable. Moreover, the smaller the ratio of the Si—$H_2$ bond against the Si—H bond, there is a more secure network of the Si—Si bond, which is preferable. In other words, the measurement result shows that the amount of total bonded hydrogen is small, which is one index of the film quality, and the ratio of Si—$H_2$ bond against the Si—H bond is as small as 0.048, which is another index of the film quality. It is shown that a good overall film quality is secured according to the present invention.

In the case of the reference property (A) of FIG. 4, the quantity of Si—H bond is 17.5% of the total bond, and the

TABLE 1

| Plasma CVD device | Inter-substrate distance (d) | Electric energy | Deposition speed | Uneven film thickness | Si—H bond amount | Si—$H_2$ bond amount | total bonded hydrogen |
|---|---|---|---|---|---|---|---|
| Present invention FIG. 1 | 20 mm | 100 kHz | 15 Å/s | ±3% (convexed) | 10.5% | 0.5% | 11% |
| Present invention FIG. 1 | 15 mm | 100 kHz | 21 Å/s | ±9% (wave form) | 12% | 1% | 13% |
| Comparison example FIG. 8 | 20 mm | 100 kHz | 14 Å/s | ±8% (concaved) | 15% | 16% | 31% |
| Comparison example FIG. 8 | 15 mm | 100 kHz | 21 Å/s | ±32% (concaved) | 17% | 19% | 36% |

In the specification, Å/s represents angstrom/sec.

First, the film deposition speed and the unevenness of film thickness are studied. According to the plasma CVD device having the structure as explained in the present invention, the film deposition speed is fast when the distance d between substrates is set to 15 mm, but the film thickness unevenness is ±9%, which is not very advantageous. When the distance d between substrates is set to 20 mm, the deposition speed is somewhat decreased but the film thickness unevenness is greatly improved to ±3%.

On the other hand, when utilizing the prior-art plasma CVD device having the structure shown in FIG. 8, the quantity of Si—H bond is 5.5% of the total bond. In other words, the film quality is deteriorated compared to that of the present invention. The reason for this is because the deposition substrate 30 is mounted on the anode electrode 13-2. By positioning the deposition substrate 30 separately from the electrode 13, or in other words, by positioning the substrate 30 away from the plasma generation space 10, a high-quality film deposition is enabled.

The material gas can be provided to the area of discharge DC by merely introducing the gas from a single hole formed to the container wall and to fill the container with gas, but it is more effective to introducing the material gas through plural induction holes arranged between adjacent electrodes, as disclosed in the present invention. The route of discharge DC is formed between the plural electrodes 13, and each discharge DC exists independently on the plane of the electrode substrate 11. By providing equal amounts of material gas to each discharge DC through plural induction holes formed between the plural electrodes 13, no area within the surface of the electrode substrate 11 is provided with less or no gas, and the gas can be provided evenly.

EXAMPLE 2

A plasma CVD device actually manufactured according to the present invention, and an a-Si film manufactured by the device will now be explained. The present embodiment utilizes a plasma CVD device shown in FIG. 7 with an enlarged view of the side having the electrodes 13, and except for the contents mentioned hereinafter, has the same structure and conditions as the device of embodiment 1.

A plural number of electrodes 13 to which are applied high-frequency output is provided in a striped manner on a dielectric (glass) plate having a size of 1 m×1 m. The length of each stripe-shaped electrodes 13 is 95 cm, the width is 8 mm, and the thickness is 100 $\mu$m. The interval between adjacent electrodes 13 is 2 mm, and the surface of all electrodes 13 faces the deposition substrate, or in other words, the surface of the electrodes 13 and the surface of the deposition substrate are parallel. On the upper surfaces of the stripe-shaped electrodes 13 is applied a paste of hyaline dielectric (relative permittivity 10) to a thickness of 1 mm, and it is then baked. An energy of 100 kHz high frequency (voltage: 1000 V) is used for providing electric energy. The impressed voltage is greater than embodiment 1, since a layer of covering dielectric 18 is provided on the electrodes 13, which allows current value to flow only transiently, so it is necessary to increase the voltage in order to secure the same electric energy supply.

Figure 7:
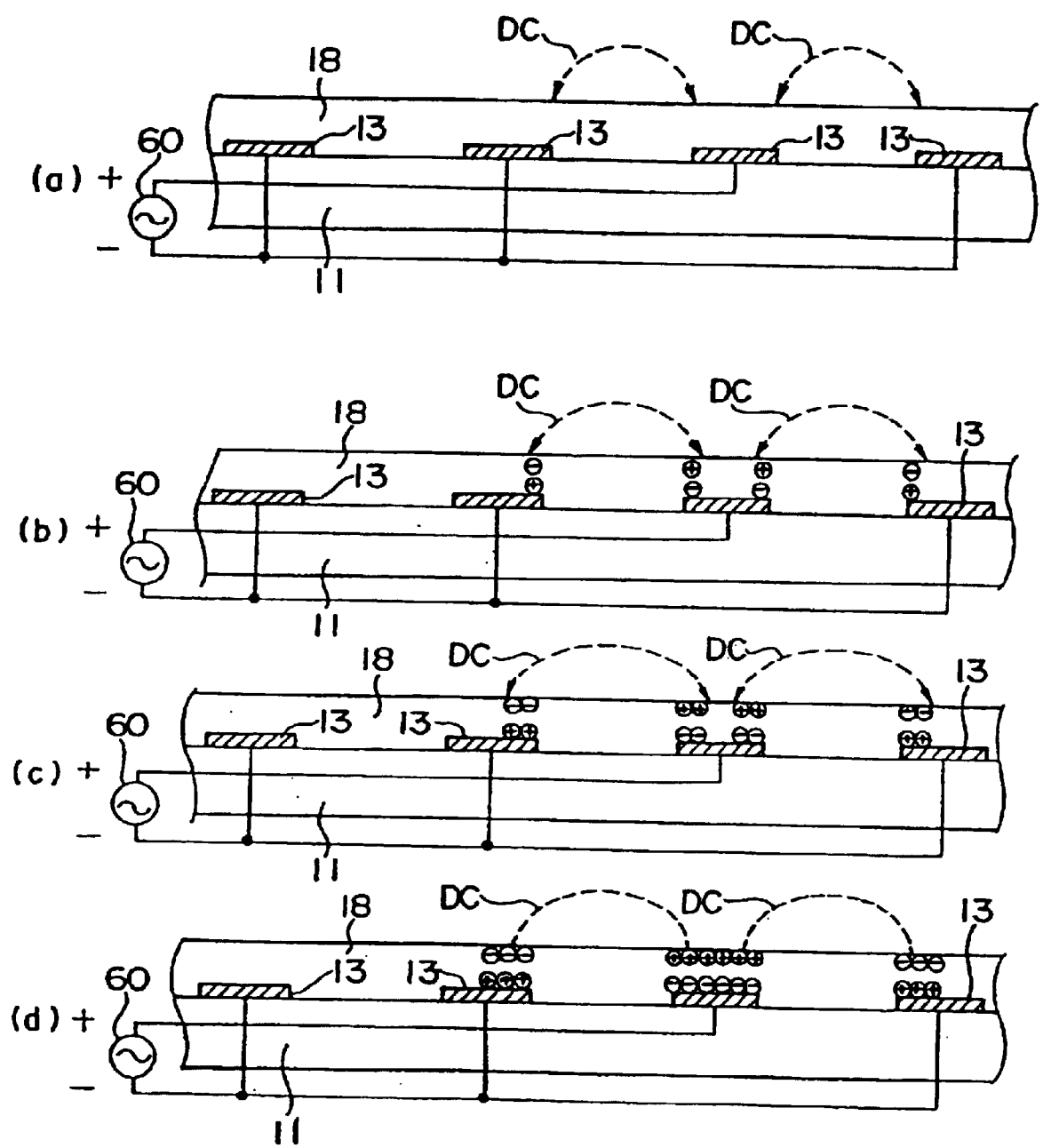
FIG. 7 is a cross-sectional view showing the outline structure of the plasma deposition device according to another embodiment of the plasma deposition device of the present invention.

The result of deposition is shown in table 2. As a means for comparison, the deposition result using the prior art-type plasma CVD device shown in FIG. 8 is included in the table. According to the prior-art device, the conditions for deposition is the same as that of the present device, except for the structure of the electrodes. The unevenness of film thickness in the table shows the ratio of deflection of the maximum value or minimum value against the average film thickness.

art-type plasma CVD device shown in FIG. 8, the deposition speed is not so different from that of the plasma CVD device according to the present invention, but the unevenness of film thickness is not as good. This is because as shown in FIG. 7, the plasma CVD device according to the present invention consumes electric energy uniformly throughout the plane of the electrode substrate 11, thereby realizing a highly uniform deposition.

Moreover, the effect of forming a covering dielectric 18 over electrodes 13 is studied. In this case, the structure of the electrodes is as shown in FIG. 7, which only differs from the structure shown in FIG. 1 in that the present structure applies a covering electrode 18 with a thickness of 500 $\mu$m on the electrodes 13. In this case, the evenness of deposition speed of the a-Si film to be formed on the deposition substrate 30 can be secured by a smaller distance between the substrates.

The reason for this is considered to be the following. The progress of discharge DC is shown in FIG. 7. When discharge DC is started at some area of the electrode 13, discharge current causes charged particles to be stored in the covering dielectric 18. Thereby, the stored charged particles reduce the potential difference generated in the space between the electrodes 13, and causes the discharge DC to stop. Then, in order to maintain discharge DC, the adjacent area on the same electrode 13 starts to discharge DC.

Since discharge DC is generated as mentioned above and charged particles are stored in the whole region of the covering dielectric 18 mounted on the electrodes 13, discharge DC will be generated more evenly. This enables to realize a uniform deposition with a shorter inter-substrate distance, and thereby increases the speed of the deposition.

Embodiment 3

The plasma CVD device actually manufactured based on the present invention, and the result of deposition of the a-Si film manufactured by the device will now be explained. The plasma CVD device used in embodiment 3 utilizes the same plasma CVD device as shown in FIG. 1, and the structure and conditions of the device is the same except for the following points. A direct-current pulse voltage (500 V) having a repetition frequency of 100 kHz with a width of 10 $\mu$s is used to provide electric energy to the device. The positive/negative polarity of the power source 60 is connected alternately to the electrodes 13 as shown in FIG. 3 so that when output of power 60 is applied to one electrode 13, no power is applied to the neighboring electrodes 13.

TABLE 2

| Plasma CVD device | Inter-substrate distance (d) | Electric energy | Deposition speed | Uneven film thickness | Si—H bond amount | Si—H$_2$ bond amount | total bonded hydrogen |
|---|---|---|---|---|---|---|---|
| Present invention FIG. 7 | 15 mm | 100 kHz | 21 Å/s | ±3% (wave form) | 12% | 1% | 13% |
| Comparison example FIG. 8 | 15 mm | 100 kHz | 21 Å/s | ±32% (convexed) | 17% | 19% | 36% |

First, the film deposition speed and the unevenness of film thickness are considered. According to the present plasma CVD device having the structure shown in FIG. 7, the film deposition speed is already fast when the distance d between substrates is set to 15 mm, and at the same time, the unevenness of film thickness is as low as ±3%, which is very advantageous. On the other hand, according to the prior The result of deposition is shown in Table 3. For means of comparison, the deposition result using the same plasma CVD device with a high frequency (100 kHz) electric energy supply (in other words, embodiment 1) is also shown. The uneven film thickness in the table shows the ratio of deflection of the maximum value or minimum value against the average film thickness.

TABLE 3

| Plasma CVD device | Inter-substrate distance (d) | Electric energy | Deposition speed | Uneven film thickness | Si—H bond amount | Si—H$_2$ bond amount | total bonded hydrogen |
|---|---|---|---|---|---|---|---|
| Present invention FIG. 1 | 20 mm | DC pulse (width 10 μs frequency 100 kHz) | 16 Å/s | ±3.5% (convexed) | 10% | 1% | 11% |
| Comparison example FIG. 1 | 20 mm | 100 kHz | 15 Å/s | ±3% (concaved) | 10.5% | 0.5% | 11% |

As apparent from Table 3, the present embodiment has a deposition speed, film-thickness unevenness and a film quality that are not very different from the embodiment where the energy supply was at a high frequency of 100 kHz. In conclusion, the electric energy to be provided to the device can either be in the form of high frequency or of direct pulse in order to obtain a similarly advantageous deposition.

The present invention as explained above realizes a plasma deposition device capable of depositing a uniform and high-quality film on a deposition substrate 30 with a large area. Along with the increasing demand for a larger liquid crystal display, it is essential to develop a technology for depositing an even film to a large-area deposition substrate 30, and the present invention provides a means for realizing such deposition technology. Moreover, in order to improve the productivity of a liquid crystal display, it is necessary to produce plural films from one deposition substrate 30. According to the present invention, the size of the deposition substrate 30 can be increased and therefore the number of films that can be produced from one deposition substrate 30 is also increased, which contributes to improved productivity.

Moreover, since both cathode and anode electrodes exist on the electrode substrate 11, the deposited film quality is very high, and not only an a-Si layer used in a TFT liquid crystal display, but also a silicon dioxide layer, a silicon nitride layer, or even a crystalline silicon layer having high quality can be produced.

Furthermore, other than the technical field related to liquid crystal displays, the present invention is also preferable for forming an a-Si layer utilized as an optical transformation layer of an amorphous-silicon solar battery that also involves depositing a film by a plasma CVD method. That is, when applying a solar battery to homes, it is indispensable to utilize a large, uniform film. Moreover, since a high quality film causes less a-Si optical deterioration, the present invention enables to provide a highly reliable amorphous-silicon solar battery.

We claim:

1. A plasma deposition device for forming a thin film having a function of introducing material gas to an interior of the deposition device, a function of generating a plasma state from said material gas by providing electric energy thereto, a function of resolving said material gas into active species, and a function of depositing said active species on a deposition substrate and forming a thin film, wherein;

said device is equipped with a plurality of electrodes that are grouped in a predetermined arrangement and positioned separately from said deposition substrate, wherein each of the plurality of electrodes has a discharge generating surface that faces parallel to the surface of said deposition substrate, and electric energy is supplied to said device by applying voltage between said electrodes to generate discharge, such that an arch shaped electric field discharge passage is formed between adjacent electrodes of the plasma deposition device, and such that based on the predetermined arrangement of the plurality of electrodes, (a) a potential difference is formed between some, but fewer than all of the plurality of electrodes, and (b) varying amounts of plasma are generated between at least some of the plurality of electrodes.

2. A plasma deposition device for forming a thin film according to claim 1, wherein said plurality of electrodes is arranged in a striped form.

3. A plasma deposition device for forming a thin film according to claim 1, wherein the surface of said plurality of electrodes is covered with a dielectric layer.

4. A plasma deposition device for forming a thin film according to claim 1, wherein said material gas is introduced to the interior through a plurality of gas introducing holes provided between said plurality of electrodes.

5. A plasma deposition device for forming a thin film according to claim 1, wherein said voltage providing electric energy to said device is applied either as a low frequency or as a high frequency.

6. A plasma deposition device for forming a thin film according to claim 5, wherein said voltage providing electric energy to said device is applied in a temporally staggered state according to the position of the electrodes.

7. A plasma deposition device for forming a thin film according to claim 5, wherein said voltage providing electric energy to said device is applied in state of direct pulse.

8. A plasma deposition device for forming a thin film according to claim 7, wherein said voltage providing electric energy to said device is applied in a temporally staggered state according to position.

9. A plasma deposition device for forming a thin film according to claim 1, wherein a plasma is generated only adjacent to discharge electrodes.

10. A plasma deposition device for forming a thin film having a plurality of discharge electrodes that are grouped in a predetermined arrangement, wherein a main surface of the plurality of discharge electrodes faces toward a deposition face of a substrate and has an arch-shaped discharge formed between adjacent electrodes of the plasma deposition device, and wherein the predetermined arrangement of the plurality of discharge electrodes causes, upon application of a voltage to the plurality of discharge electrodes, (a) a potential difference to be formed between some, but fewer than all of the plurality of discharge electrodes, and (b) varying amounts of plasma to be generated between at least some of the plurality of discharge electrodes.

11. A plasma deposition device for forming a thin film according to claim 10, wherein a plasma is generated only adjacent to discharge electrodes.

12. A plasma deposition device for forming a thin film according to claim 10, wherein the plurality of discharge electrodes are arranged in a striped form.

13. A plasma deposition device for forming a thin film according to claim 10, wherein the plurality of discharge electrodes are arranged in a dot-like manner.

14. A plasma deposition device for forming a thin film according to claim 10, wherein the main surface of the plurality of discharge electrodes is covered with a dielectric layer.

15. A plasma deposition device for forming a thin film according to claim 10, wherein a material gas is introduced to the interior of the plasma deposition device through a plurality of induction holes provided between the plurality of discharge electrodes.

16. A plasma deposition device for forming a thin film according to claim 10, wherein an electric energy provided between paired discharge electrodes is more than 100 KHz high frequency.

17. A plasma deposition device for forming a thin film according to claim 16, wherein the high frequency is a direct-current pulse voltage.

18. A plasma deposition device for forming a thin film according to claim 10, wherein each of the plurality of discharge electrodes includes switches to switch anode and cathode electrodes, and wherein a voltage that provides electric energy to the plasma deposition device is applied in a temporarily staggered state according to the position of the electrodes.

19. A plasma deposition device for forming a thin film according to claim 18, wherein the anode and cathode electrodes are capable of switching alternately.

20. A plasma deposition device for forming a thin film according to claim 18, wherein at least one group of anode electrodes and a plurality of groups of cathode electrodes are arranged adjacent to each other, and wherein the number of anode electrodes in the at least one group of anode electrodes is less than the number of cathodes in the plurality of groups of cathode electrodes.

21. A plasma deposition device for forming a thin film, comprising:
   a reaction chamber having an electrode disposed therein, the electrode having plurality of discharge electrodes that are grouped in a predetermined arrangement;
   a gas supply unit for supplying gas into the reaction chamber; and
   a power source for supplying electric energy to the electrode, the electric energy applied to a pair of the discharge electrodes being effective to cause generation of plasma, wherein the plasma is effective to resolve the material gas into active species and to deposit the active species on a deposition surface of a substrate, and
   wherein a main surface of the plurality of discharge electrodes faces the deposition surface of the substrate and has an arch-shaped discharge, and
   wherein the predetermined arrangement of the plurality of discharge electrodes causes, upon application of a voltage to the plurality of discharge electrodes,
      (a) a potential difference to be formed between some but fewer than all of the plurality of discharge electrodes, and
      (b) varying amounts of plasma to be generated between at least some of the plurality of discharge electrodes.

22. A plasma deposition device for forming a thin film according to claim 21, wherein the plasma is generated only adjacent to the discharge electrodes.

23. A plasma deposition device for forming a thin film according to claim 21, wherein the plurality of discharge electrodes are arranged in a striped form.

24. A plasma deposition device for forming a thin film according to claim 21, wherein the plurality of discharge electrodes are arranged in a dot-like manner.

25. A plasma deposition device for forming a thin film according to claim 21, wherein the main surface of the discharge electrodes is covered with a dielectric layer.

26. A plasma deposition device for forming a thin film according to claim 21, wherein the material gas is introduced to the interior of the plasma deposition device through a plurality of induction holes provided between the plurality of discharge electrodes.

27. A plasma deposition device for forming a thin film according to claim 21, wherein the electric energy supplied between the pair of discharge electrodes is a high frequency of at least 100 kHz.

28. A plasma deposition device for forming a thin film according to claim 27, wherein the high frequency is a direct-current pulse voltage.

29. A plasma deposition device for forming a thin film according to claim 21, wherein each of the plurality of discharge electrodes includes switches to switch anode and cathode electrodes, and wherein the position of the anode electrode is varied temporally.

30. A plasma deposition device for forming a thin film according to claim 29, wherein the anode and cathode electrodes are switched alternately.

31. A plasma deposition device for forming a thin film according to claim 29, wherein the time average of electric energy supplied to each of the discharge electrodes is equal.

32. A plasma deposition device for forming a thin film according to claim 29, wherein at least one group of anode electrodes and a plurality of groups of cathode electrodes are arranged adjacent to each other, and wherein the number of anode electrodes in the group of anode electrodes is less than the number of cathodes in the group of cathode electrodes.

* * * * *